United States Patent
Chin et al.

(10) Patent No.: US 8,025,736 B2
(45) Date of Patent: Sep. 27, 2011

(54) SEMICONDUCTOR DEVICE FABRICATION EQUIPMENT FOR PERFORMING PEOX PROCESS AND METHOD INCLUDING CLEANING THE EQUIPMENT WITH REMOTELY PRODUCED PLASMA

(75) Inventors: Kyoung-Hwan Chin, Suwon-si (KR); Kyoung-In Kim, Hwaseong-si (KR); Hak-Su Jung, Hwaseong-si (KR); Kyoung-Min An, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 754 days.

(21) Appl. No.: 11/942,761

(22) Filed: Nov. 20, 2007

(65) Prior Publication Data
US 2008/0115801 A1    May 22, 2008

(30) Foreign Application Priority Data
Nov. 21, 2006    (KR) .................. 10-2006-0114902

(51) Int. Cl.
*C25F 3/12*    (2006.01)
(52) U.S. Cl. ............. 134/1.1; 134/1.2; 134/1.3; 134/2; 134/21; 134/22.1; 134/26; 134/28; 134/30; 134/31; 134/34; 134/35; 134/36; 134/41; 134/42; 134/902; 438/710; 438/726; 438/727; 438/730; 438/905; 438/909
(58) Field of Classification Search .............. 134/1.1, 134/1.2, 1.3, 2, 21, 22.1, 26, 28, 30, 31, 34, 134/35, 36, 41, 42, 902; 438/710, 726, 727, 438/730, 905, 909
See application file for complete search history.

(56) References Cited

U.S. PATENT DOCUMENTS

| 4,960,488 | A | * | 10/1990 | Law et al. ................ 438/694 |
|---|---|---|---|---|
| 5,207,836 | A | * | 5/1993 | Chang .................. 134/1 |
| 5,843,239 | A | * | 12/1998 | Shrotriya ............... 134/1.1 |
| 6,067,999 | A | * | 5/2000 | Hines et al. ............ 134/1.1 |
| 6,274,500 | B1 | * | 8/2001 | Xuechun et al. ........ 438/706 |
| 6,787,054 | B2 | * | 9/2004 | Wang et al. ............. 216/72 |
| 6,872,322 | B1 | * | 3/2005 | Chow et al. ............. 216/67 |
| 6,935,351 | B2 | * | 8/2005 | Shibata et al. ........... 134/22.1 |
| 2003/0029475 | A1 | * | 2/2003 | Hua et al. ............... 134/1.1 |
| 2003/0037802 | A1 | * | 2/2003 | Nakahara et al. ........ 134/1.1 |
| 2004/0000321 | A1 | * | 1/2004 | Cui et al. ............... 134/1.2 |
| 2004/0200498 | A1 | * | 10/2004 | Wang et al. ............. 134/1.1 |
| 2004/0248404 | A1 | | 12/2004 | Subrahmanyan et al. |
| 2005/0082001 | A1 | * | 4/2005 | Sugiura ................. 156/345.28 |
| 2005/0211265 | A1 | * | 9/2005 | Zheng et al. ............ 134/1.1 |
| 2007/0264443 | A1 | * | 11/2007 | Choi et al. .............. 427/561 |

* cited by examiner

*Primary Examiner* — Bibi Carrillo
(74) *Attorney, Agent, or Firm* — Volentine & Whitt, PLLC

(57) ABSTRACT

Semiconductor device fabrication equipment performs a PEOX (physical enhanced oxidation) process, and includes a remote plasma generator for cleaning a process chamber of the equipment. After a PEOX process has been preformed, a purging gas is supplied into the process chamber to purge the process chamber, and the remote plasma generator produces plasma using a first cleaning gas. Accordingly, a reactor of the remote plasma generator is cleaned by the first cleaning gas plasma. Subsequently, the purging gas is supplied to purge the process chamber, and the remote plasma generator produces plasma using a second cleaning gas to remove the first cleaning gas plasma from the remote plasma generator and the process chamber. Finally, full flush operations are performed to remove any gases remaining in the process chamber.

6 Claims, 4 Drawing Sheets

SEMICONDUCTOR DEVICE FABRICATION EQUIPMENT FOR PERFORMING PEOX PROCESS AND METHOD INCLUDING CLEANING THE EQUIPMENT WITH REMOTELY PRODUCED PLASMA

BACKGROUND OF THE INVENTION

1. Field of the Invention

The present invention relates to semiconductor device fabrication equipment. More particularly, the present invention relates to semiconductor device fabrication equipment for performing a physical enhanced oxidation (PEOX) process, and the present invention relates to a method of cleaning such semiconductor device fabrication equipment using plasma.

2. Description of the Related Art

The fabrication of semiconductor devices, such as integrated circuits, generally entails forming layers on a substrate such as a silicon wafer. For example, metal may be deposited on the substrate and patterned to form a conductive layer or an insulating layer may be formed on the substrate to electrically insulate one conductive layer from another. Various technologies have been developed for depositing the different materials that constitute the various layers on the substrate. In this respect, a chemical vapor deposition (CVD) process has been developed to form insulating layers, for example, on the substrate.

CVD processes include thermal deposition processes, in which precursor gas or vapor react in response to the heated surface of a substrate, and plasma-enhanced CVD (PECVD) processes, in which electromagnetic energy is applied to at least one precursor gas or vapor to transform the precursor or vapor into reactive plasma. The use of such plasma allows layers to be formed at a relatively low temperature and/or at a relatively high rate. Therefore, a plasma-enhanced process is more desirable than a thermal deposition process for many applications.

However, residue of a deposition process adheres to the walls of the deposition chamber and other components of the deposition system when a layer is being formed on a substrate. This aspect of the deposition process is generally undesirable because the residue can build up and become a source of particulate contamination for substrates subsequently processed in the deposition chamber. Several types of cleaning processes have been developed to remove the residue from the inside of the chamber. One type of cleaning process, known as a "wet cleaning" process, is performed by partially disassembling the deposition chamber and wiping the surfaces down with appropriate cleaning fluids. Other types of cleaning processes use plasma to convert the residue to a volatile product, and then use the exhaust system of the equipment to remove the volatile product from the deposition chamber. These processes are known as "dry cleaning" processes.

There are two general types of plasma dry cleaning processes. One type forms plasma inside the processing chamber, or in situ. The other type forms plasma in a remote plasma generator and then directs the plasma to flow into the processing chamber. The remote plasma cleaning process offers several advantages. For example, a remote plasma generator can be readily integrated with a deposition system which does not have an in situ plasma system to provide the system with the ability to perform a dry cleaning process. Furthermore, a remote plasma generator may be more efficient than an in situ plasma system in converting cleaning plasma precursor gas or vapor into plasma. Still further, when plasma is formed outside the chamber, as with the case of a remote plasma generator, the interior of the deposition chamber is protected from potentially undesirable effects of the plasma formation process, such as heat and sputtering effects.

A conventional dry cleaning process using a remote plasma generator is disclosed in U.S. Pat. No. 6,329,297. In this process, the cleaning plasma formed in the remote plasma generator is diluted before the plasma is fed into the deposition chamber. As a result, the deposition chamber is more thoroughly, uniformly and rapidly cleaned. This dry cleaning process is applied to a PECVD system, which uses tetraethylorthosilane (TEOS) or silane, for example, to form a silicon oxide layer on a substrate. The system is cleaned by converting nitrogen trifluoride ($NF_3$) precursor gas into plasma using a remote microwave plasma generator, diluting the remotely-formed nitrogen trifluoride ($NF_3$) plasma with diatomic nitrogen gas ($N_2$), and then introducing the mixture into the deposition chamber of the system through a gas inlet nozzle. The cleaning process may be applied to deposition systems that process 200 mm wafers, and can be scaled for use with deposition systems that process 300 mm wafers. Also, in this cleaning process, the amount of diluent can be adjusted to minimize the time required to clean the deposition chamber.

U.S. Pat. No. 6,329,297 also discloses that the remotely generated plasma subsequently diluted with $N_2$ can be used to etch the wafer. The flow rate of the etching plasma precursor may be controlled to optimize the plasma conversion efficiency and/or conserve the precursor, whereas the flow rate of the diluent may be controlled to produce a desired etching profile across the wafer and/or etch the wafer at a desired rate.

FIG. 1 illustrates a conventional CVD system 10, of a type manufactured by Novellus of San Jose, Calif., which can perform either thermal CVD or PECVD processes. The CVD system 10 basically includes a processing chamber 15 comprising chamber walls 15a and a chamber lid assembly 15b, a pedestal 12 disposed within the processing chamber 15 for supporting a substrate (e.g., a semiconductor wafer) to be processed, and a gas distribution manifold 11 through which process gases are fed into the processing chamber 15. The body of the pedestal 12 is made of aluminum or ceramics, for example, and has a flat (or slightly convex) surface 12a on which the substrate is supported. The pedestal 12 may also have a resistance heater (not shown) embedded in its body to heat the substrate during the process. The resistance heater may comprise a single resistive heating element in the form of two concentric circles. Power is supplied to the heating element through wires that pass through a stem 12c of the pedestal and out of the bottom of the pedestal where they are connected to an external power source (not shown). The pedestal may also have a radio frequency (RF) electrode and/or a susceptor.

The pedestal 12 is movable by a motor and transmission mechanism, including a ball screw, between a lower position and an upper position (indicated by dashed line 14) at which the pedestal is adjacent to the manifold 11. An unprocessed substrate is loaded onto the pedestal 12 or a processed substrate is unloaded from the pedestal 12 when the pedestal is at the lower position. More specifically, when the pedestal 12 is lowered, lift pins 12b of the pedestal contact a lift pin plate 33 and are thereby raised relative to surface 12a such that the pins 12b are at a height at which a substrate can be transferred by a robot (not shown) onto the pins 12b through an opening 26 in the side of the chamber. Subsequently, the robot is withdrawn from the chamber 15 and the motor is operated to raise the pedestal 12 to the upper position. At this time, the lift pins 12b are retracted into the pedestal 12 so that the substrate comes to rest on the surface 12a of the pedestal and is thereby raised with the pedestal to the upper position. A centerboard (not shown) has sensors for providing information on the relative position of the pedestal 12.

The CVD system 10 also has gas panel 6 including gas sources 7a-d, gas supply lines 8 connected to the gas sources 7a-d, respectively, and a mixing block 9 to which the gas supply lines 8 are connected. Each supply line 8 is typically provided with safety shut-off valves (not shown) along the length thereof. The shut off valves are operative to shut off the flow of gas through the line 8 automatically, either through local or remote control. Alternatively, the shut-off valves can be controlled manually to shut off the flow of gas through the line 8. The gas panel 6 also includes mass flow controllers (not shown) or other devices which control the flow of gas through the supply lines 8. Gases flowing through respective ones of the gas supply lines 8 are mixed in the mixing block 9 before being fed by the manifold 11 into the chamber 15. In addition, the gases fed into the processing chamber 15 through the manifold 11 are dispersed across the substrate by a perforated blocker plate 42 and a circular distribution faceplate 13a.

As mentioned above, the CVD system 10 can perform either thermal CVD processes or PECVD processes. The PECVD process may use plasma formed in situ or may use plasma formed in a remote plasma generator 27. Also, the substrate may or may not be heated during a PECVD process.

In a PECVD process in which the plasma is formed in situ, an RF power source 44 applies RF power between the gas distribution faceplate 13a and the pedestal 12 to form plasma in a reaction region between the faceplate 13a and the surface 12a of the pedestal 12. Constituents of the plasma react to form a desired layer on the surface of the semiconductor wafer supported on pedestal 12.

The RF power source 44 can be regulated to supply power at a high RF frequency of 13.56 MHz and/or a low RF frequency of 360 KHz. Using high and low frequencies to form the plasma enhances the decomposition of reactive species introduced into the processing chamber 15.

In a remote plasma process, a process gas from gas source 7a is supplied to a chamber 29 of a remote plasma generator 27. A microwave source 28 of the remote plasma generator 27 irradiates the chamber 29 with microwave energy to form plasma. The plasma flows through the gas distribution faceplate 13a into the processing chamber 15. When the plasma is formed by the remote plasma generator 27, the typical byproducts of plasma formation, such as high-energy photons and heat, do not directly affect the processed wafer or the interior of the processing chamber 15. Furthermore, some plasma precursor gases may be more efficiently dissociated in a remote microwave plasma generator than in a lower frequency in situ plasma system.

In a thermal process, the pedestal 12 is heated to heat the surface of the substrate, process gases are fed through supply lines into mixing block 9, and the resulting process gas mixture is fed into the processing chamber 15 and is dispersed across the surface of the substrate by gas distribution faceplate 13a. The process gas mixture reacts with the heated surface of the substrate to form a layer on the surface of the substrate.

The temperature of the walls 15a of the processing chamber 15 and surrounding structures, such as an exhaust passageway 23 and a shut-off valve 24, may be controlled by circulating fluid through channels (not shown) in the walls 15a of the chamber 15. The fluid can be used to heat or cool the chamber walls 15a depending on the desired effect. For example, a coolant may be used to remove heat from the system during an in situ plasma process, or to limit the formation of residue on the walls 15a of the chamber 15. On the other hand, circulating a heated liquid through the channels in the walls 15a of the chamber 15 may help maintain an even thermal gradient during a thermal deposition process.

Similarly, the gas distribution manifold 11 has heat exchange passages 18 through which heated fluid is circulated. Typical fluids that are circulated through the heat exchange passages 18 include water-based ethylene glycol mixtures and oil-based thermal transfer fluids. This heating of the gas distribution manifold 11 results in the heating of the process gases fed through the manifold 11, and beneficially minimizes or prevents reactants of the process from condensing on the walls 15a of the processing chamber.

The portion of the gas mixture that does not take part in the reaction which forms a layer on the substrate, as well as byproducts of the reaction, are evacuated from the chamber by an exhaust system that includes a vacuum pump 30. Note, the heating of the manifold 11 as described above helps eliminate volatile components of the process gases and other contaminants that might contaminate the process if they were to condense on the walls of the exhaust system and migrate back into the processing chamber during periods in which gas is not flowing through the exhaust system The vacuum pump 30 is in communication with the processing chamber 15 via an annular orifice 16 that surrounds the reaction region, and an annular exhaust plenum 17 into which the annular orifice 16 opens. The annular orifice 16 and the plenum 17 are defined by and between an upper annular surface of a dielectric lining 19 provided on the side wall of the chamber 15 and the bottom circular surface of the chamber lid 20. The circular symmetry and uniformity of the orifice 16 and the plenum 17 help to create an essentially uniform flow of process gases over the wafer so that a uniform layer is formed on the wafer.

The gases exhausted through the exhaust plenum 17 flow through a lateral extension 21 of the plenum 17, past a viewing port (not shown), past a vacuum shut-off valve 24 (integrated with the bottom wall of the chamber 15), and into an exhaust outlet 25 of the exhaust system. A throttle valve 32 is interposed between the exhaust outlet 25 and a foreline 31 of the exhaust system to maintain a desired pressure and/or gas flow in the processing chamber 15. In some processes or during some portions of a process, the position of the throttle valve is set by a system controller 34 according to feedback from a pressure sensor (not shown) connected to the controller 34. In other processes or during some portions of a process, the feedback loop is disabled and the throttle valve is fixed in position. In any case, the draw of the processing chamber 15 can be modulated by the throttle valve while the vacuum pump 30 operates at a constant rate. A lift mechanism operated by a motor 35 moves up and down a heater pedestal assembly 12.

In addition to the throttle valve 25, the system controller 34 controls various subsystems and mechanisms of the CVD system 10 according to a program 70 stored in a computer-readable memory 38. Signals are transmitted to and from the system controller 34 through control lines 36, only a few of which are shown for simplicity. The controller 34 relies on feedback signals from sensors, such as optical sensors, to determine the position of movable mechanical assemblies, such as the throttle valve 32 and pedestal 12, and thereby operate the motors that operate the assemblies.

The memory 38 may be preferably a hard drive, but may be a read-only memory, a randomly addressable memory, a floppy disk drive or any other suitable auxiliary memory device. The processor 37 includes a single-board computer (SBC), analog and digital input/output boards, interface boards and stepper motor controller boards. Various parts of the CVD system 10 conform to the Versa Modular European (VME) standard which defines board, card cage, and connector dimensions and types. The bus structure has a 16-bit data bus and a 24-bit address bus to conform to the VME standard.

The system controller 34 executes the computer program 70 stored in the computer-readable memory 38 to control the deposition system to carry out a particular process. That is, the computer program includes sets of instructions that dictate the timing, mixture of gases, chamber pressure, chamber temperature, RF power levels, pedestal position, and other parameters of a particular process to be executed by the CVD system 10. Other computer programs stored in other memory devices including, for example, a floppy disk or other appropriate drives, may also be used by the controller 34 to command the various subsystems and assemblies.

The CVD system 10 is well-suited to carry out a PETEOS process. However, the system is not well-suited to carry out a PEOX process using $SiH_4$, $N_2O$ and $N_2$ gases. In this latter case, $NF_3$ which is used by the remote plasma generator 27 to generate plasma used to clean the CVD system reacts with the $SiH_4$ and thereby produces particles that contaminate the system. FIG. 2 shows the particles that contaminate a wafer processed in the system after a PEOX process has been carried out 50 times prior.

SUMMARY OF THE INVENTION

Therefore, an object of the present invention is directed to provide semiconductor device fabrication equipment in which particles will not be produced on a substrate during a PEOX process after a remote plasma cleaning process has been performed.

Similarly, an object of the present invention is to provide a method of dry cleaning a chamber of semiconductor device fabrication equipment used to perform a PEOX process, and which method will not result in particles being produced on a substrate processed in the chamber after the chamber has been cleaned with remotely produced plasma.

Another object of the present invention is to provide semiconductor device fabrication equipment capable of performing a PEOX process and in which a residue will not be left on surfaces in the equipment after the equipment has been cleaned with plasma remotely produced using $NF_3$.

Similarly, another object of the present invention is to provide a remote plasma method of dry cleaning a chamber of semiconductor device fabrication equipment with plasma remotely produced using $NF_3$, and which method will not leave a residue on surfaces in the equipment even when the equipment is used to perform a PEOX process.

In accordance with an aspect of the present invention, there is provided semiconductor device fabrication equipment comprising a process chamber, and a remote plasma generator that is connected to the process chamber and can produce plasma using either a first cleaning gas or a second cleaning gas. In this respect, cleaning gas supply lines connect first and second cleaning gas sources to the remote plasma generator, and remote plasma supply piping connects the remote plasma generator to the process chamber. On the other hand, main process gas supply piping connects first and second process gas sources, which supply first and second process gases, respectively, to the process chamber. Also, a valve disposed in the main process gas supply piping is controllable to selectively allow and interrupt the flow of a mixture of the first and second process gases through the main gas supply piping. The main process gas supply piping is connected to a gas distribution manifold downstream of the valve. Furthermore, shower heads are disposed in the process chamber to inject the mixture of the first and second process gases fed through the gas distribution manifold into the process chamber. And, an exhaust system including a process gas exhaust line is connected to the bottom of the process chamber.

In accordance with another aspect of the present invention, there is provided a method of using remotely produced plasma to clean semiconductor device fabrication equipment having a processing chamber in which a PEOX process is carried out, wherein the reaction chamber of the remote plasma generator is first cleaned with plasma produced using a first cleaning gas, the process chamber of the semiconductor device fabrication equipment is subsequently cleaned with remote plasma produced using a second cleaning gas, and then the system is flushed a number of times.

The reaction chamber of the remote plasma generator is first cleaned by supplying the first cleaning gas into a reactor of the remote plasma generator of the semiconductor device fabrication equipment, and by forming plasma in the reactor using the first cleaning gas. At the same time, a purging gas is supplied through the main process gas supply piping into the process chamber to prevent the back-flow of the first cleaning gas plasma. The process chamber is cleaned by supplying the second cleaning gas to the remote plasma generator and generating plasma using the second cleaning gas. For example, the second cleaning gas may be supplied with a flow rate of 1500 sccm for 120 seconds. As a result, any first cleaning gas plasma remaining in the remote plasma generator and the process chamber is removed. At the same time, the process chamber is purged with the purging gas.

According to another aspect of the present invention, there is provided a method used in the fabrication of semiconductor devices, comprising processing substrates in a process chamber by feeding process gases from process gas sources through main gas supply piping into the process chamber, removing the substrates from the process chamber after they have been processed, and periodically performing the cleaning process summarized above.

The substrates may be processed by feeding a mixture of the process gases into the process chamber. In this case, the full flush operation may be performed by alternately supplying the purging gas into lines through which the process gases are supplied, respectively. In particular, the purging gas may be supplied into each of lines with a flow rate of 9000 sccm for 333 seconds at a time.

BRIEF DESCRIPTION OF THE DRAWINGS

The above and other objects, features and advantages of the present invention will become more apparent to those of ordinary skill in the art by referring to the detailed description of the preferred embodiments thereof that follows as made with reference to the attached drawings in which.

DETAILED DESCRIPTION OF THE PREFERRED EMBODIMENTS

Figure 1:
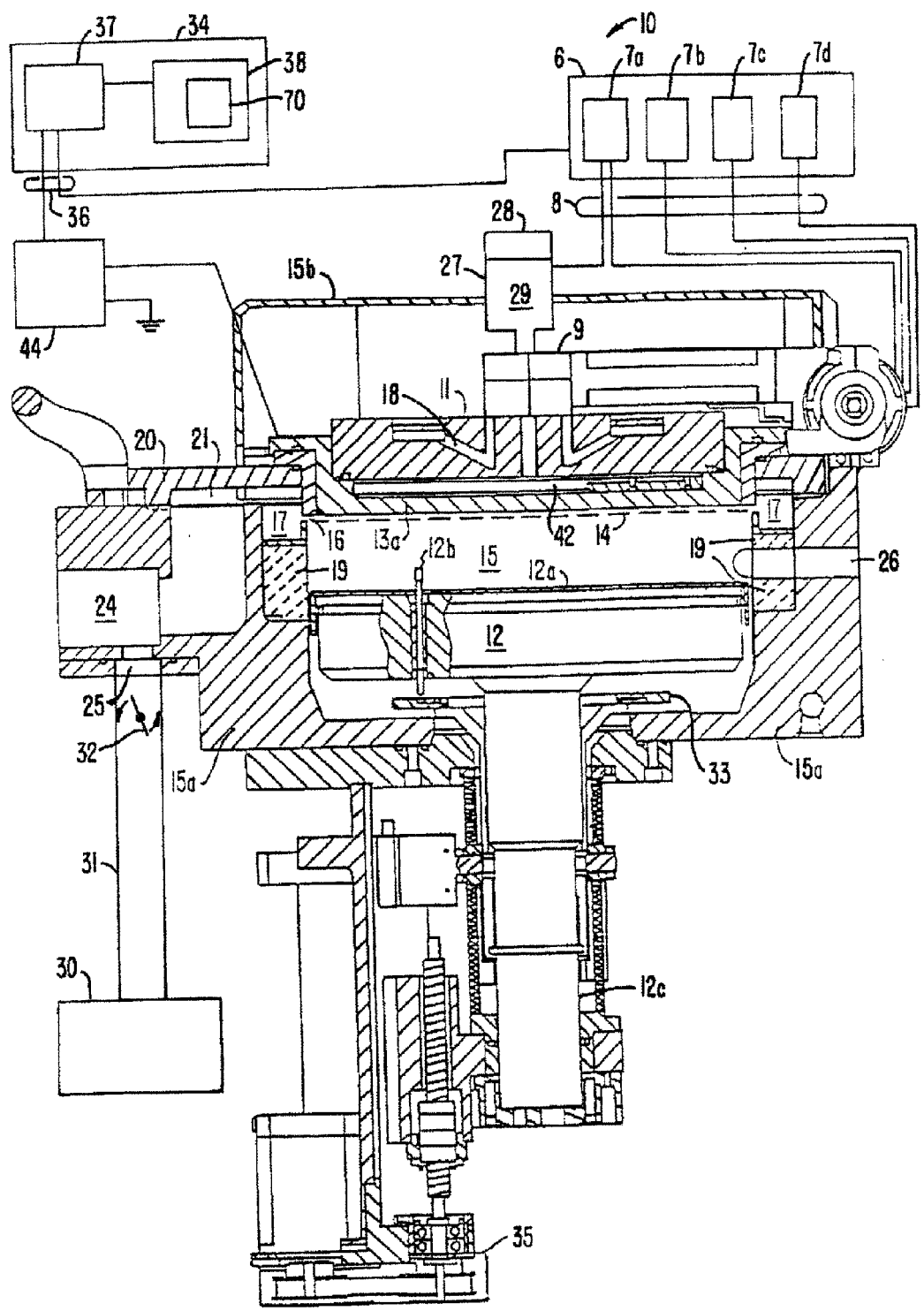
FIG. 1 is a side view, partially in section and partially schematic, of conventional chemical vapor deposition (CVD) equipment having a remote plasma chamber.
Figure 2:
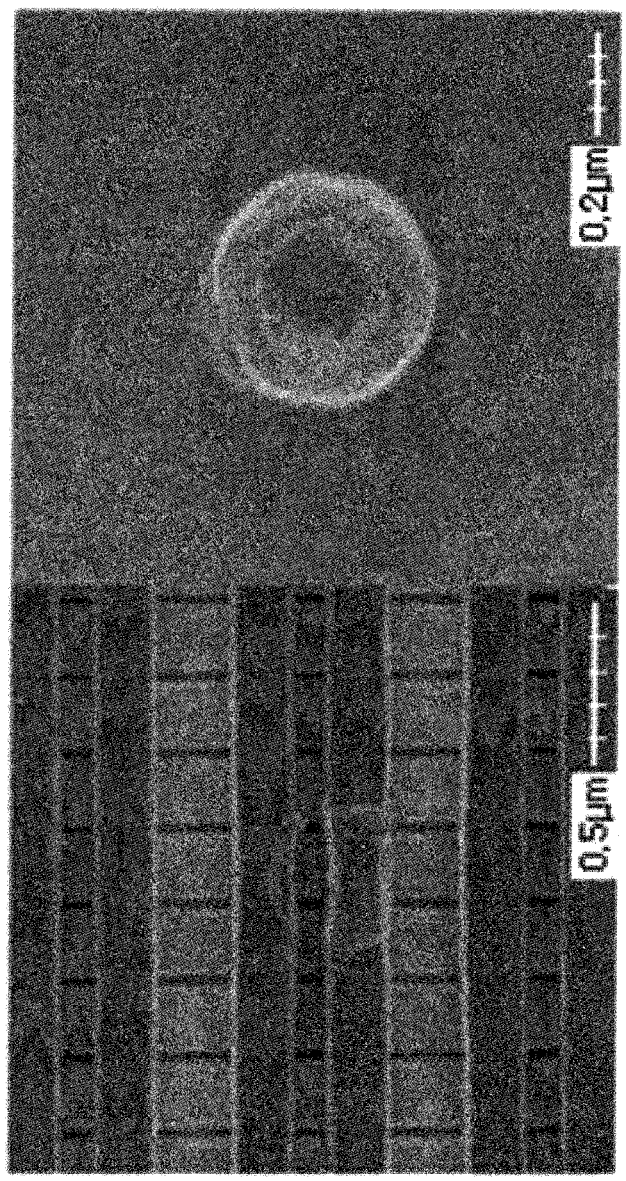
FIG. 2 includes a photograph of a wafer, and enhancements of the image, showing particles that are formed on the wafer after a PEOX process is performed using conventional CVD equipment.
Figure 2:
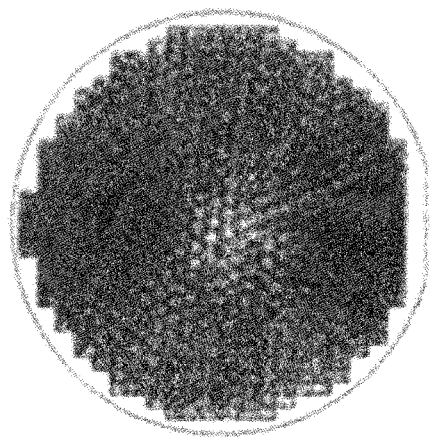

The present invention will now be described more fully hereinafter with reference to FIGS. 3 and 4. However, those components whose function and structure are well-known in the art, per se, will not be described in further detail for the sake of clarity. For example, those components of the present invention that are similar to those of the system described above in connection with FIG. 1 will not be described in particular detail.

Figure 3:
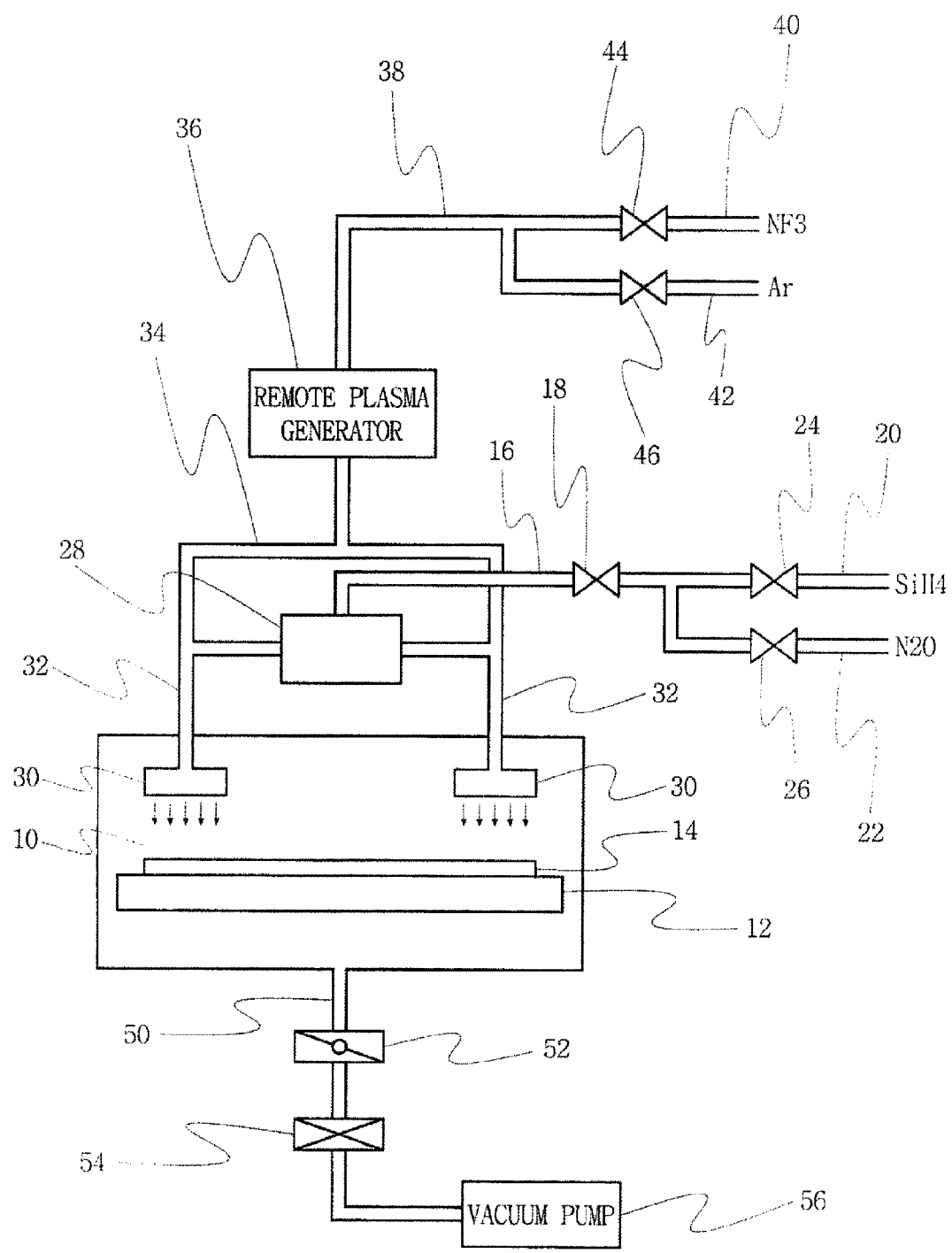
FIG. 3 is a schematic diagram of semiconductor device fabrication equipment according to present invention.

Referring now to FIG. 3, semiconductor device fabrication equipment according to the present invention comprises: a process chamber 10; sources of $SiH_4$ and $N_2O$ gas; a chuck 12 disposed in the process chamber 10 for supporting a substrate, e.g., a wafer 14; main process gas supply piping 16; a first air valve 18 disposed in the main process gas supply pipe 16 and automatically operable to selectively allow and interrupt the flow of gas through the main process gas supply piping 16; a first process gas supply line 20 connecting the source of $SiH_4$ to the main process gas supply piping 16; a second process gas supply line 22 connecting the source of $N_2O$ to the main process gas supply pipe 16; a second air valve 24 disposed in the first process gas supply line 20 and operable to selectively allow and interrupt the flow of $SiH_4$ through the first process gas supply line 20; a third air valve 26 disposed in the second process gas supply line 22 and operable to allow and interrupt the flow of $N_2O$ through the second process gas supply line 22; a gas distribution manifold 28 for distributing a mixture of the process gases fed through the main process gas supply piping 16; distribution pipes 32 connected to the gas distribution manifold 28; shower heads 30 to which the distribution pipes 32 are respectively connected for injecting the mixture of the process gases into the process chamber 10; a remote plasma generator 36 for generating plasma outside the process chamber 10; a plasma supply line 34 connecting the remote plasma generator 36 to the distribution pipes 32; sources of $NF_3$ and Ar; a cleaning gas supply line 38 connected to the remote plasma generator 36; a first cleaning gas supply line 40 connecting the source of $NF_3$ to the cleaning gas supply line 38; a second cleaning gas supply line 42 connecting the source of Ar to the cleaning gas supply line 38; a fourth air valve 44 disposed in the first cleaning gas supply line 40 and operable to allow and interrupt the flow of $NF_3$ through the first cleaning gas supply line 40; a fifth air valve 46 disposed the second cleaning gas supply line 42 and operable to allow and interrupt the flow of Ar through the second cleaning gas supply line 42; a process gas exhaust line 50 connected to the bottom of the process chamber 10; a throttle valve 52 disposed in the process gas exhaust line 50 for controlling the pressure in and/or rate of gas flow through the process chamber 10; a vacuum pump 56 connected to the process chamber by the gas exhaust line 50 so that the vacuum pump 56 can create a vacuum in the process chamber 10; and a hi-vacuum valve 54 disposed in the gas exhaust line 50 between the process chamber 10 and the vacuum pump 56 and operable to selectively place the process chamber 10 in communication with the vacuum pump 56 and prevent the process chamber 10 from communicating with the vacuum pump 56.

A method of forming a PEOX layer on a substrate using the semiconductor device fabrication equipment according to the present invention will now be described.

The first, second and third air valves 18, 24 and 26 are opened so that the $N_2O$ and $SiH_4$ flow as a mixture into the manifold 28 through the main process gas supply piping 16. The gas mixture is then fed by the gas distribution manifold 28 to the shower head 30 via the distribution pipes 32. The shower head 30 injects the mixture of the process gases into the process chamber 10. The mixture of the process gases injected into the process chamber 10 is converted to plasma in the process chamber 10 and the plasma is directed onto the wafer 14. As a result, a PEOX layer is formed on the wafer 14.

The process chamber 10 needs to be periodically cleaned, e.g., the process chamber 10 needs to be cleaned after a certain number of wafers have been processed in the chamber 10. The process chamber 10 is cleaned using a dry cleaning process. To this end, the remote plasma generator 36 is employed. In addition, the remote plasma generator 36 also needs to be cleaned periodically. A method of cleaning the remote plasma generator 36 and the process chamber 10 will be described with reference to FIGS. 3 and 4.

Figure 4:
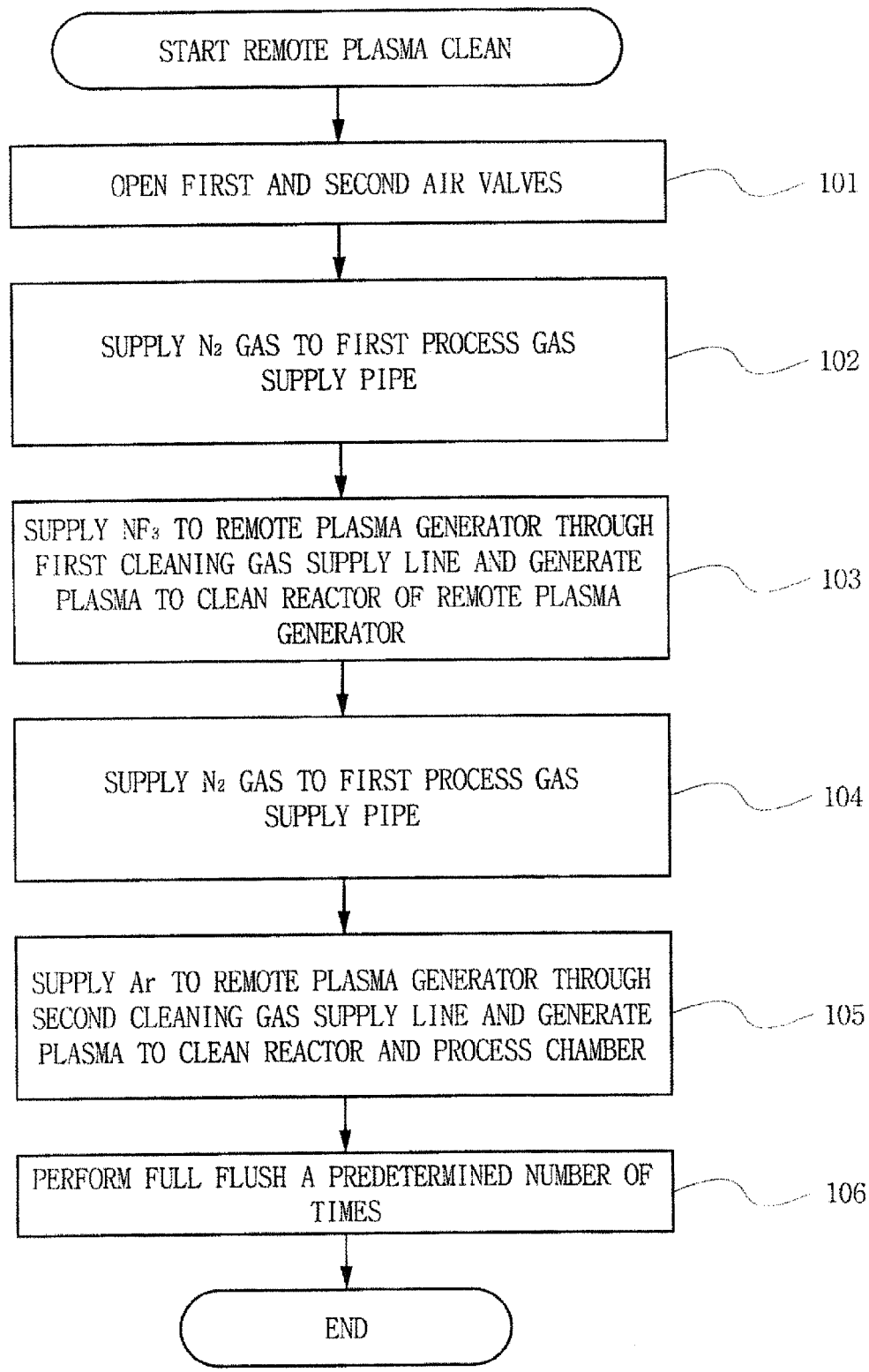
FIG. 4 is a flow chart of a method of cleaning semiconductor device fabrication equipment according to the present invention.

First, the first and second air valves 18 and 24 are opened (step 101 in FIG. 4). Next, $N_2$ is supplied to the first process gas supply line 20 (step 102). For example, $N_2$ may be supplied with a flow rate of 1500 sccm. Also, the fourth air valve 44 is opened so that $NF_3$ is supplied to the remote plasma generator 36 through the first cleaning gas supply line 40, and RF power is applied to the reactor of the remote plasma generator 36 to generate plasma (step 103).

As a result, the interior of the reactor of the remote plasma generator 36 is cleaned. The $NF_3$ plasma used to clean the reactor of the remote plasma generator 36 flows into the process chamber 10 through the plasma supply line 34 and is discharged from the process chamber 10 through the process gas exhaust line 50 by the vacuum pump 56. At this time, the $N_2$ supplied through the first process gas supply line 20 prevents the $NF_3$ from back-flowing. The remote plasma generator 36 is turned off once it has been cleaned.

Subsequently, $N_2$ is supplied to the first process gas supply line 20 (step 104). For example, $N_2$ may be supplied with a flow rate of 1500 sccm. Also, the fifth air valve 46 is opened and Ar is supplied to the remote plasma generator 36 through the second cleaning gas supply line 42 (step 105). For example, Ar may be supplied with a flow rate of 1500 sccm for 120 seconds. At this time, RF power is applied to the remote plasma generator 36 to generate plasma to purge the reactor of the remote plasma generator 36 and the process chamber 10 of $NF_3$.

The second air valve 24 and the fifth air valve 46 are closed and the remote plasma generator 36 is turned off once the remote plasma generator 36 and the process chamber 10 have been purged.

Next, a full flush operation is performed ten times, for example (step 106). In a full flush operation, the first and second air valves 18 and 24 are opened and $N_2$ is supplied through the first process gas supply line 20. For example, $N_2$ may be supplied with a flow rate of 9000 sccm for 333 seconds. Subsequently, the second air valve 24 is closed, the third air valve 26 is opened, and $N_2$ is supplied through the second process gas supply line 22. For example, $N_2$ may be supplied with a flow rate of 9000 sccm for 333 seconds. At this time, the $N_2$ flowing into the process chamber 10 is exhausted through the process gas exhaust line 50 by the vacuum pump 56. As a result, the $N_2$ purges the process chamber 10 to remove any gases remaining in the process chamber 10.

As described above, in accordance with the present invention, $NF_3$ plasma used in a dry clean process to clean the process chamber of semiconductor device fabrication equipment for performing a PEOX process is removed from the process chamber. Therefore, the $NF_3$ will not react with process gas, namely SiH4, subsequently fed into the process chamber. Therefore, particles are prevented from being formed on the wafer during the PEOX process. Furthermore, because the inside of the process chamber is prevented from being contaminated by the reaction between $NF_3$ and the process gases, the process chamber does not have to be often disassembled in order to be cleaned. In a typical application, the process chamber of semiconductor device fabrication equipment according to the present invention needs to be disassembled only once every six months in order to be cleaned.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A method of cleaning semiconductor device fabrication equipment having a processing chamber in which a PEOX process using $SiH_4$ is carried out, and a remote plasma generator connected to the processing chamber, the method comprising:

supplying $N_2$ into the processing chamber of the semiconductor device fabrication equipment through a main process gas supply piping connected to the processing chamber and through which process gas, comprising $SiH_4$, is supplied into the processing chamber during the processing of a substrate;

supplying $NF_3$ into a reactor of the remote plasma generator of the semiconductor device fabrication equipment and forming plasma in the reactor using the $NF_3$, to thereby clean the reactor of the remote plasma generator and the processing chamber while the $N_2$ is flowing through the main process gas supply piping into the processing chamber;

after the reactor of the remote plasma generator and the processing chamber are cleaned, supplying $N_2$ into the processing chamber to purge the processing chamber;

supplying Ar to the remote plasma generator and generating plasma using the Ar to remove any $NF_3$ remaining in the remote plasma generator and the processing chamber while the process chamber is being purged by the $N_2$; and subsequently performing a full flush operation a predetermined number of times to remove from the processing chamber any gases remaining in the process chamber.

2. The method according to claim 1, wherein the full flush operation is performed by alternately supplying $N_2$ through process gas supply pipes respectively connecting sources of process gases, used to process a substrate in the process chamber, to the main gas supply piping.

3. A method used in the fabrication of semiconductor devices, the method comprising:

processing substrates in a process chamber, and removing the substrates from the process chamber after they have been processed, the processing of each of the substrates including feeding $SiH_4$ through a main gas supply piping into the process chamber; and periodically performing a dry cleaning process while no substrate to be processed is present in the process chamber, the dry cleaning process comprising:

supplying $N_2$ into the process chamber through the main gas supply piping, supplying $NF_3$ into a reactor of a remote plasma generator connected to the process chamber and forming plasma in the reactor using the $NF_3$, to thereby clean the reactor of the remote plasma generator and the process chamber while the $N_2$ is flowing through the main process gas supply piping into the process chamber, after the reactor of the remote plasma generator and the process chamber are cleaned, supplying $N_2$ into the process chamber to purge the process chamber, supplying Ar to the remote plasma generator and generating plasma using the Ar to remove any $NF_3$ remaining in the remote plasma generator and the process chamber while the process chamber is being purged by the $N_2$, and subsequently performing a full flush operation a predetermined number of times to remove from the process chamber any gases remaining in the process chamber.

4. The method according to claim 3 wherein the processing of each of the substrates comprises forming plasma in situ in the process chamber using the $SiH_4$, and directing the plasma onto the substrate.

5. The method according to claim 4, wherein the processing of each of the substrates comprises feeding $N_2O$ into the process chamber along with the $SiH_4$.

6. The method according to claim 5, wherein the full flush operation is performed by alternately supplying $N_2$ through process gas supply pipes respectively connecting sources of the $SiH_4$ and $N_2O$ to the main gas supply piping.

* * * * *